United States Patent
Hirano et al.

(10) Patent No.: US 8,625,073 B2
(45) Date of Patent: Jan. 7, 2014

(54) EXPOSURE APPARATUS AND DEVICE MANUFACTURING METHOD

(75) Inventors: Shinichi Hirano, Utsunomiya (JP); Ryota Makino, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/610,308

(22) Filed: Sep. 11, 2012

(65) Prior Publication Data

US 2013/0077068 A1  Mar. 28, 2013

(30) Foreign Application Priority Data

Sep. 26, 2011  (JP) .................................. 2011-209100

(51) Int. Cl.
    *G03B 27/42* (2006.01)
    *G03B 27/54* (2006.01)

(52) U.S. Cl.
    USPC ............................................. 355/53; 355/67

(58) Field of Classification Search
    USPC ..................... 355/53, 67–71; 250/548, 292.2; 356/399–401
See application file for complete search history.

(56) References Cited

U.S. PATENT DOCUMENTS

| 6,680,774 | B1 | 1/2004 | Heinle |
| 6,967,710 | B2 * | 11/2005 | Shiraishi ..................... 355/67 |
| 8,064,043 | B2 * | 11/2011 | Irie .............................. 355/71 |
| 2011/0267595 | A1 * | 11/2011 | Mori ............................. 355/67 |

FOREIGN PATENT DOCUMENTS

JP  2005-286062 A  10/2005

* cited by examiner

*Primary Examiner* — Hung Henry Nguyen
(74) *Attorney, Agent, or Firm* — Canon U.S.A., Inc. IP Division

(57) ABSTRACT

An exposure apparatus including an optical system, includes a light shielding plate, a rotational drive unit configured to rotatably drive the light shielding plate around an axis of rotation along an optical path in the optical system, a shift drive unit configured to shift-drive the light shielding plate in a direction intersecting the axis of rotation, an acquisition unit configured to acquire information relating to a relative position between a reference axis serving as a reference when a pattern image is projected on a substrate by the optical system and the axis of rotation, and a control unit configured to control the rotational drive unit and the shift-drive unit so that, when projecting the pattern image on a circumferential portion near an outer edge of the substrate, the light shielding plate is positioned at a predetermined position based on the information relating to the relative position.

7 Claims, 14 Drawing Sheets

EXPOSURE APPARATUS AND DEVICE MANUFACTURING METHOD

BACKGROUND OF THE INVENTION

1. Field of the Invention

One disclosed aspect of the embodiments relates to an exposure apparatus and a device manufacturing method.

2. Description of the Related Art

Recently, flip-chip mounting is being employed more frequently for the mounting of semiconductor devices. The manufacturing operations of a semiconductor device performed based on flip-chip mounting include an operation of forming a solder ball on the device.

An example of a known method for forming a solder ball is a plating method. In a plating method, in order to bring a conductive film formed on the wafer (substrate) into contact (be in a conductive state) with the electrode in the plating apparatus, the portion of the resist formed on the conductive film for contacting the electrode has to be peeled away.

If the resist is a negative resist, this process may be performed by preventing the exposure light from irradiating a circumferential portion of the wafer. Specifically, this process may be performed by shielding the circumferential portion of the wafer. For example, U.S. Pat. No. 6,680,774 discusses a technique in which a light shielding plate is arranged on a wafer during exposure.

Japanese Patent Laid-Open No. 2005-286062 discusses an imprinting apparatus that transfers a mold pattern onto a resist by irradiating UV-rays on the resist that is arranged on a wafer in contact with a mold. In the technique discussed in Japanese Patent Laid-Open No. 2005-286062, in order to define irradiation regions respectively corresponding to shot regions of peripheral parts of the wafer, four light shielding plates having arcs respectively corresponding to the outline of regions corresponding to first to fourth quadrants on a wafer are driven in an X-axis direction and a Y-axis direction, respectively.

If a light shielding plate is arranged on a wafer like in U.S. Pat. No. 6,680,774, since the light shielding plate has to be retracted each time the wafer is replaced, there are restrictions in terms of space and throughput.

Rather than arranging the light shielding plate on the wafer, the light shielding plate could be arranged on a face that is optically conjugated with the wafer, as discussed in Japanese Patent Application Laid-Open No. 2005-286062, and could shield a peripheral region of the wafer with this light shielding plate. In such a technique, the light shielding plate is positioned so that the distance from the periphery of the wafer to the boundary of the peripheral region is constant (i.e., a peripheral region on the inner side is shielded for a predetermined width from the periphery of the wafer) based on the position of a periphery shot region on the wafer for each periphery shot region.

However, when shielding the wafer based on its outer shape as a reference, the distance between a drive reference position of the light shielding plate drive unit for driving the light shielding plate and the actual center position of the wafer (position that will serve as the exposure reference) is not always the same.

If the distance between the drive reference position of the light shielding plate and the center position of the wafer is misaligned, when the light shielding plate is positioned based on the position of the periphery shot region on the wafer, the light shielding plate will be mispositioned by that displacement amount. Consequently, the distance from the periphery of the wafer to the boundary of the peripheral region is different for each periphery shot region, so that the width of the peripheral region shielded by the light shielding plate may not be set the same.

SUMMARY OF THE INVENTION

One disclosed aspect of the embodiments is directed to an exposure apparatus and a device manufacturing method capable of reducing displacement from a desired position due to the effect of displacement between an actual drive reference position of a light shielding plate drive unit and a position serving as an exposure reference (e.g., an optical axis position).

According to an aspect of the embodiments, an exposure apparatus including an optical system having an illumination optical system configured to illuminate an original formed with a pattern with light from a light source and a projection optical system configured to project an image of the pattern on a substrate that includes an arc-shaped portion on an outer edge, includes a light shielding plate arranged on or near to a conjugate plane with a object plane of the projection optical system on an optical path in the optical system, and including an arc-shaped portion for defining at least a part of an outer edge of a region on which the pattern image is projected on the substrate in an arc shape, a rotational drive unit configured to rotatably drive the light shielding plate around an axis of rotation along an optical path in the optical system, a shift drive unit configured to shift-drive the light shielding plate in a direction intersecting the axis of rotation, an acquisition unit configured to acquire information relating to a relative position between a reference axis serving as a reference when the pattern image is projected on the substrate by the optical system and the axis of rotation, and a control unit configured to control the rotational drive unit and the shift-drive unit so that, when projecting the pattern image on a circumferential portion near an outer edge of the substrate, the light shielding plate is positioned at a predetermined position based on the information relating to the relative position.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the disclosure and, together with the description, serve to explain the principles of the disclosure.

DESCRIPTION OF THE EMBODIMENTS

Figure 1:
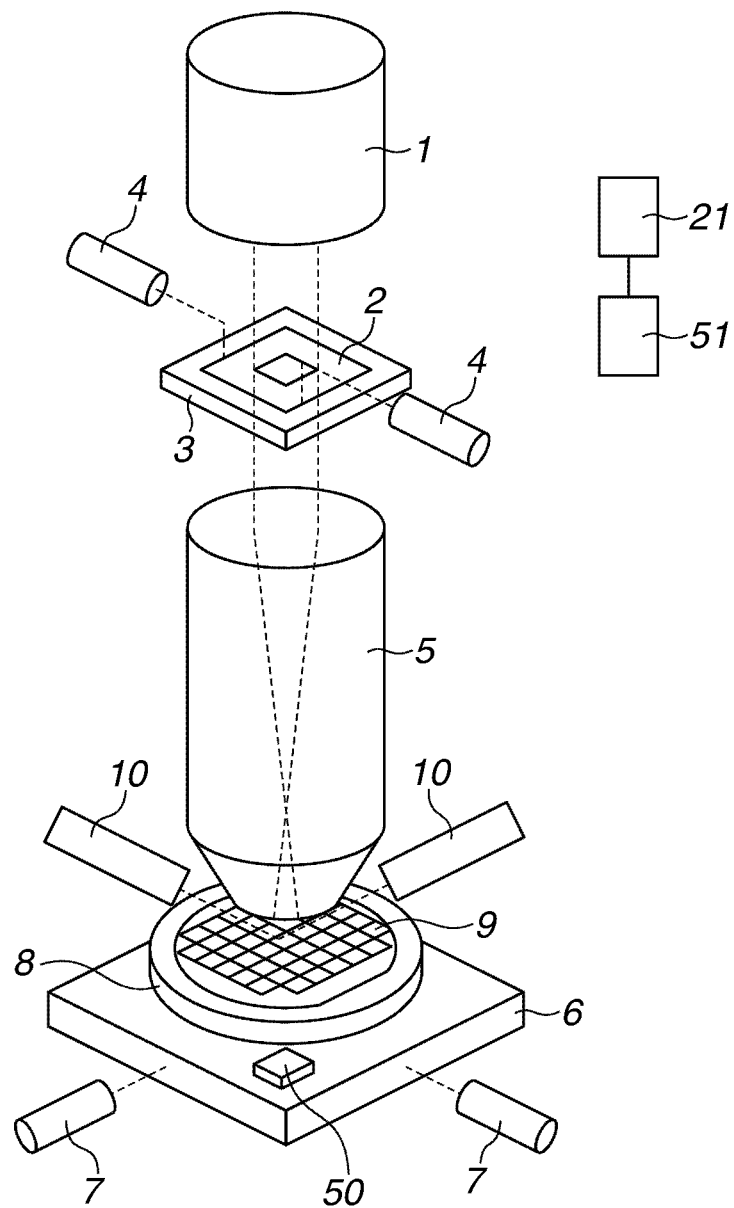
FIG. 1 illustrates a configuration of an exposure apparatus according to an aspect of the embodiments.

Various exemplary embodiments, features, and aspects of the disclosure will be described in detail below with reference to the drawings.

In the drawings, same parts are denoted with the same reference numerals, and a repeated description of such parts will be omitted.

FIG. 1 illustrates a configuration of an exposure apparatus 100 including an optical system configured from an illumination optical system and a projection optical system according to an aspect of the embodiments. The exposure apparatus 100 is a lithography apparatus that projects a reticle (mask) pattern as an original on a substrate (shot region on the substrate) with the projection optical system, and transfers the reticle pattern onto the substrate.

The exposure apparatus 100 includes an illumination optical system 1 for illuminating a reticle 2 with light from a light source, and a reticle stage 3 for holding and moving the reticle 2 having a pattern (circuit pattern) to be transferred onto a substrate (wafer, glass substrate etc.) 9. Further, the exposure apparatus 100 includes an alignment detection unit 4. The alignment detection unit 4 detects the position of the reticle 2 that is held on the reticle stage 3, and the position of an alignment mark on the substrate 9 through a projection optical system 5.

In the present exemplary embodiment, the alignment detection unit 4 has a function of detecting the position of the reticle 2 held on the reticle stage 3, and a function of detecting the position of the alignment mark on the substrate 9. However, the reticle alignment detection unit for detecting the position of the reticle 2 held on the reticle stage 3 and the substrate alignment detection unit for detecting the alignment mark on the substrate 9 may be separately arranged.

Further, the exposure apparatus 100 includes a projection optical system 5 for projecting a pattern of the reticle 2 onto the substrate 9, a substrate stage 6 that holds and moves the substrate 9 (moves at least in an X-axis direction and a Y-axis direction in the XY plane), and a laser interferometer 7 for measuring the position of the substrate stage 6. The exposure apparatus 100 also includes a chuck 8 that suctions to stick (holds) the substrate 9, and a Z-axis movement mechanism (not illustrated) for moving the substrate 9 arranged on a lower portion of the chuck 8 in a Z-axis direction (perpendicular direction, i.e., is a mechanism for adjusting the focus during exposure).

In addition, the exposure apparatus 100 includes an autofocus unit 10 for measuring the position (focus position) in the Z-axis direction of the substrate 9 held on the substrate stage 6, and a control unit 21 including a central processing unit (CPU) and a memory, for controlling the entire exposure apparatus 100 (operations for exposing the substrate 9). The exposure apparatus 100 also includes a light detection sensor 50 for detecting the exposure light quantity on the substrate stage 6 and an input interface 51 that allows the parameters necessary for apparatus control to be input from outside the apparatus, including displacement between the center position of the projection optical system and the center of rotation of the light shielding plate drive unit.

Figure 2:
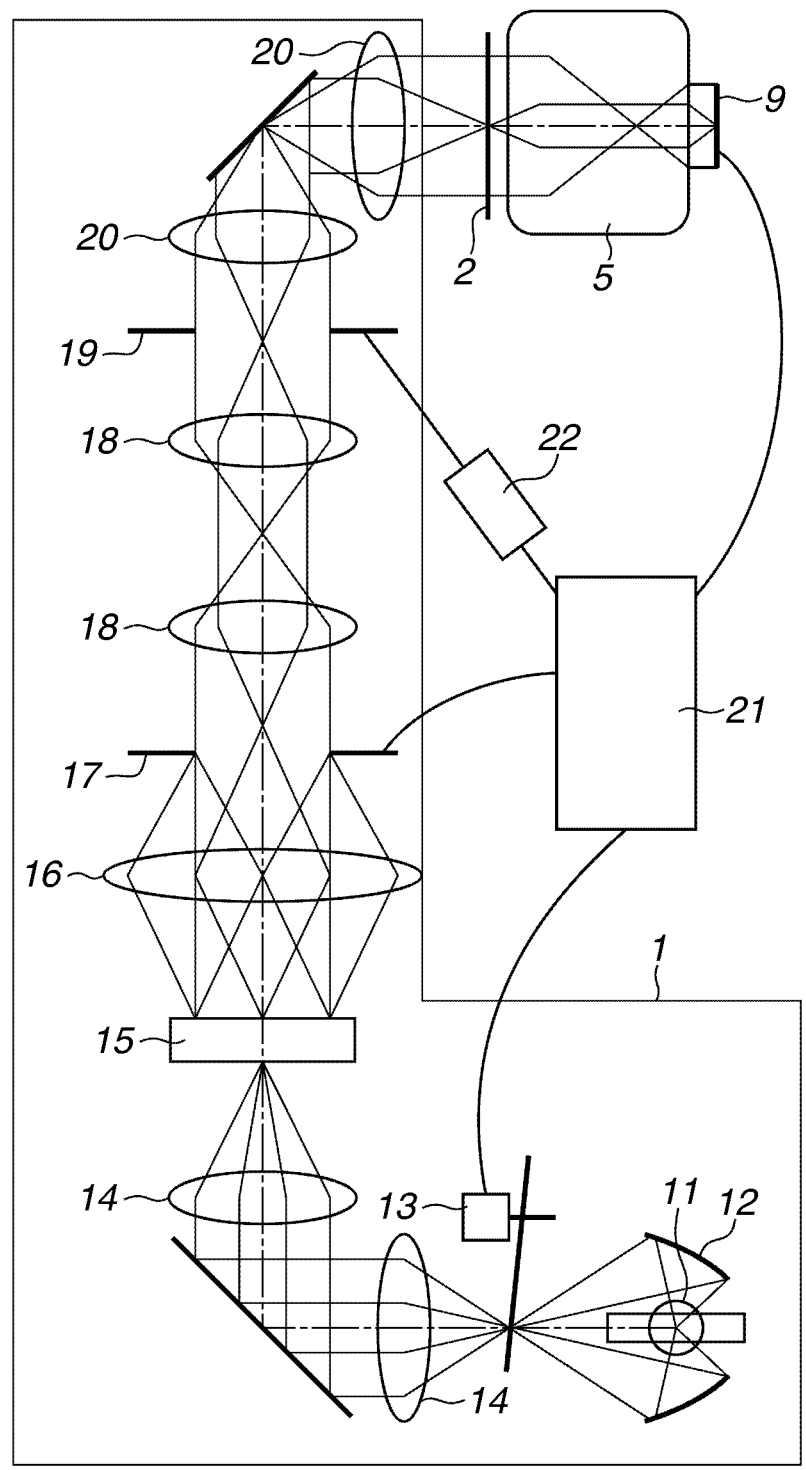
FIG. 2 illustrates a configuration of an illumination optical system in detail.

FIG. 2 illustrates a configuration of the illumination optical system 1 in detail. As illustrated in FIG. 2, in the present exemplary embodiment, the illumination optical system 1 includes a light source 11. However, the illumination optical system 1 does not necessarily have to include the light source 11, and the illumination optical system 1 and the light source 11 may be separately provided.

Although in the present exemplary embodiment an ultra-high pressure mercury lamp is used as the light source 11, an excimer laser (KrF excimer laser or ArF excimer laser etc.) may also be used. For a condenser mirror 12, usually, an elliptical mirror is used. However, the condenser mirror 12 is not limited to an elliptical mirror. A facet mirror optimized so as to increase the degree of concentration at the condensing point may also be used.

A shutter 13 adjusts the exposure amount on the substrate 9 on which a resist (photosensitizing agent) has been coated by adjusting open/close time under the control of the control unit 21.

A zoom relay optical system 14, which has a zoom function, changes the light flux diameter at a fly-eye lens 15. In the exposure apparatus 100, to optimize the imaging forming ability of the projection optical system 5 according to the pattern to be transferred onto the substrate 9, a coherence factor (σ value) represented by (numerical aperture (NA) of illumination optical system 1)/(NA of projection optical system 5) is required.

In the present exemplary embodiment, the σ value may be changed by changing the light flux diameter at the fly-eye lens 15 that determines the NA of the illumination optical system 1.

The fly-eye lens 15 splits the light flux incident on an entrance surface at the wave front to generate a secondary light source on the exit surface. The fly-eye lens 15 may be replaced with a cylindrical lens array. A condenser optical system 16 superimposes the beams of light split at the wavefront by the fly-eye lens 15 over each other on the surface to be illuminated to form a uniform illuminance distribution on the surface to be illuminated.

A masking blade 17 is arranged on the surface to be illuminated of the condenser optical system 16. The masking blade 17, which is configured from a variable aperture diaphragm, determines the shape of one shot region (shot shape) to be repeatedly transferred by the exposure apparatus 100 by an operation and repeat method under the control of the control unit 21. In other words, the masking blade 17 shields the light incident on a region further outwards than the straight sides defining the outer edge of the shot region on the substrate.

A relay optical system 18 projects the illuminance distribution formed on a position of the masking blade 17 onto a light shielding plate 19. Further, a relay optical system 20 projects the illuminance distribution formed on a position of the light shielding plate 19 onto the reticle 2.

The light shielding plate 19 may change the shape of the region on which the pattern is transferred according to the exposure position of the substrate 9 during the repeated exposure of the substrate 9 by the exposure apparatus 100 by the operation and repeat method.

The light shielding plate 19 is arranged on or near to a conjugate plane with the object plane of the projection optical system 5 in the illumination optical system 1. The light shielding plate 19 includes on its edge an arc (an arc-shaped portion) that overlaps a circular boundary line on the inner side from the periphery of the substrate 9, and defines the region where the pattern is to be transferred onto the substrate 9.

The light shielding plate 19 may function as a desired light shielding member as long as it is arranged on or near to a conjugate position with the object plane of the projection optical system 5 on the optical path in the optical system configured from the illumination optical system 1 and the projection optical system 5. Further, the expression "a conjugate position with the object plane of the projection optical system 5" may also be restated as "a conjugate position with the pattern face that is determined by the arrangement of the reticle 2".

The light shielding plate 19 is driven in the periphery shot region on the substrate 9 via a drive unit 22. For example, under the control of the control unit 21, the drive unit 22 rotatably drives the light shielding plate 19 around the axis parallel to the optical axis of the illumination optical system 1, and linearly drives the light shielding plate 19 in the plane perpendicular to the optical axis of the illumination optical system 1.

In the present exemplary embodiment, in terms of the arrangement of the parts, the masking blade 17 and the light shielding plate 19 are arranged at different optically conjugate positions in the illumination optical system 1, with the relay optical system 18 arranged therebetween. However, if there is no problem in terms of arrangement, the masking blade 17 may be arranged adjacent to the light shielding plate 19. If the masking blade 17 is to be arranged adjacent to the light shielding plate 19, but these parts do not fit in the same position, it is desirable to arrange the light shielding plate 19 at an optically conjugate position with the substrate 9, and arrange the masking blade 17 at a defocused position.

If the defocused amount due to such an arrangement is not acceptable, the light is shielded by the masking blade 17 so that the light is not incident on the region further outwards than the straight sides defining the outer edge along a first direction in the shot region. Further, a light shielding member for shielding the light with a Cr pattern on the reticle 2 is provided so that the light is not incident on the region further outwards than the straight sides defining the outer edge along a second direction orthogonal to a first direction in the shot region.

In addition, the shape of the shot region may be determined by a Cr pattern on the reticle 2. To prevent transfer due to defects such as peeling of the Cr pattern on the reticle 2, the masking blade 17 may shield light over a larger region than the shape of the shot region. The order of the arrangement position of the masking blade 17 and the light shielding plate 19 in the illumination system does not matter. Either of these parts may be arranged on the light source 11 side.

Figure 3A:
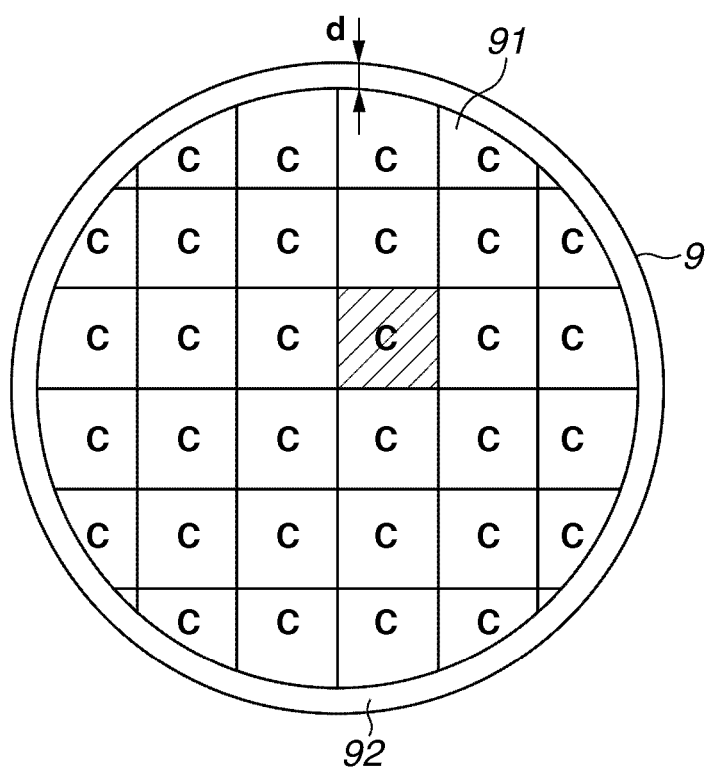
FIGS. 3A and 3B illustrate a transfer region on a substrate.

The light shielding plate 19 will now be described in more detail. FIG. 3A illustrates a transfer region on the substrate 9 seen from above the face of a paper sheet. Although a substrate made from silicon is usually used for the substrate 9, substrates made from glass, sapphire, or a compound may also used.

Although the region on which the pattern may be transferred by the exposure apparatus 100 in one exposure is determined based on the image forming region of the projection optical system 5, it is generally smaller than the size of the substrate 9. Therefore, an exposure method that repeats the transfer of the pattern (exposure of the substrate 9) while stepping the substrate 9 is used in the exposure apparatus 100. This method is called a "step and repeat method".

The region indicated by the hatched lines in FIG. 3A indicates the shot region on which the pattern is transferred by one exposure. By repeatedly exposing a plurality of shot regions while stepping the substrate 9, the same pattern "C" may be transferred onto the whole of the substrate 9.

As described above, in the operation of forming a solder ball, a region where the resist has been peeled away has to be present on the substrate 9 in order to bring the conductive film on the substrate 9 into contact (be in a conductive state) with the electrode in the plating apparatus.

As illustrated in FIG. 3A, this region corresponds to a circumferential portion of the substrate 9, i.e., a peripheral region 92 that is on the inner side from the periphery of the substrate 9 by a predetermined width (in the present exemplary embodiment, "d"). The peripheral region 92 of the substrate 9 needs to be shielded during exposure if the resist coated on the substrate 9 is a negative resist. In other words, when transferring the pattern onto a periphery shot region 91 of the substrate 9, the periphery shot region 91 needs to be exposed by defining a transfer region like that illustrated in FIG. 3B, i.e., defining a part of the outer edge of the shot in an arc shape.

Figure 3B:
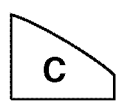
Figure 4:
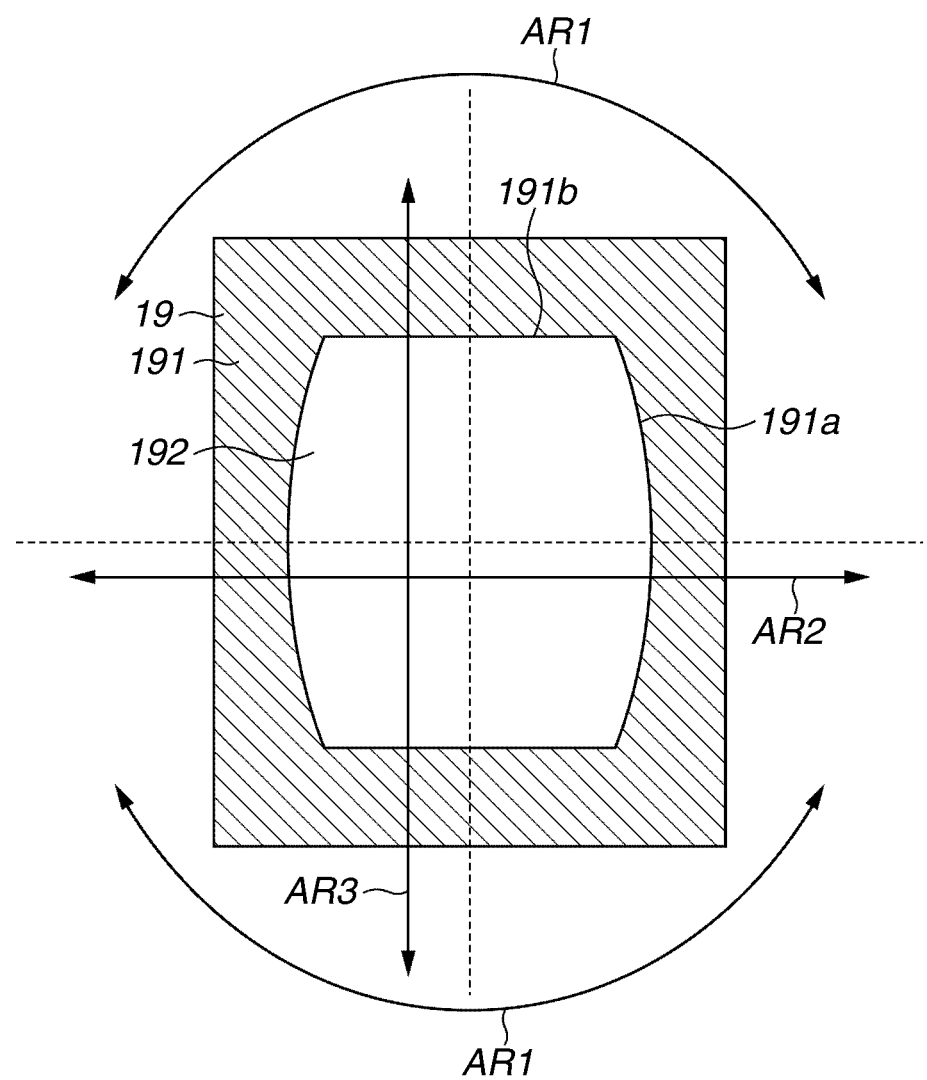
FIG. 4 illustrates an example of a configuration of a light shielding plate.

FIG. 4 illustrates an example of a configuration of the light shielding plate 19 for defining the periphery shot region 91 as a transfer region like that illustrated in FIG. 3B. In FIG. 4, the light shielding plate 19 is viewed from the optical axis direction of the illumination optical system 1.

The light shielding plate 19 is configured from a light shielding portion 191 for shielding the exposure light and an aperture portion 192 that allows the exposure light to pass through. The light shielding portion 191 is a frame that includes an arc-shaped and a roughly identical arc-shaped edge portion 191a of the periphery (outer edge) of the substrate 9, and a straight edge portion 191b that does not directly contribute to the light shielding of the peripheral region 92 of the substrate 9.

Ideally, it is desirable for the arc edge portion 191a, which is the arc-shaped portion of the light shielding plate 19, to be a circular and roughly identical arc shape that is smaller than the radius (radius of curvature) of the circular shape of the arc-shaped portion of the periphery (outer edge) of the substrate 9 by the amount "d".

The aperture portion 192 has a size that is big enough to allow light flux broader than the light flux necessary to illuminate the exposed shot region to pass.

When exposing (projecting an image of the pattern) a shot near the center of the substrate 9, the light shielding plate 19 is retracted and moved to a position that allows light flux broader than the light flux contributing to exposure of the shot to pass through the aperture portion 192. At that time, the light flux has cross-section defined as a rectangular shape by the masking blade 17, which is another light shielding member, not by the light shielding plate 19.

However, the light shielding plate 19 is not limited to the configuration illustrated in FIG. 4. The light shielding plate 19 may be configured by a light shielding portion that includes a circular edge portion, or may be configured by a light shielding portion in which only a part includes an arc-shaped edge portion.

This is because the drive unit 22 may rotatably drive the light shielding plate 19 in a rotating direction (arrow AR1) around the optical axis of the illumination optical system 1, and linearly drive the light shielding plate 19 in a direction (arrow AR2) parallel to a straight line connecting the apexes of the arc edge portion 191a.

Further, the drive unit 22 has two mechanisms such as a rotational drive unit for rotatably driving the light shielding plate 19 in a rotating direction (arrow AR1) around the optical axis, and a shift-drive unit for shift-driving (translation driving) the light shielding plate 19 in a direction (arrow AR2) parallel to a straight line connecting the apexes of the arc edge portion 191a. In addition, the drive unit 22 may also have another shift-drive unit mechanism for shift-driving in a direction (arrow AR3) perpendicular to a straight line connecting the apexes of the arc edge portion 191a.

Figure 5:
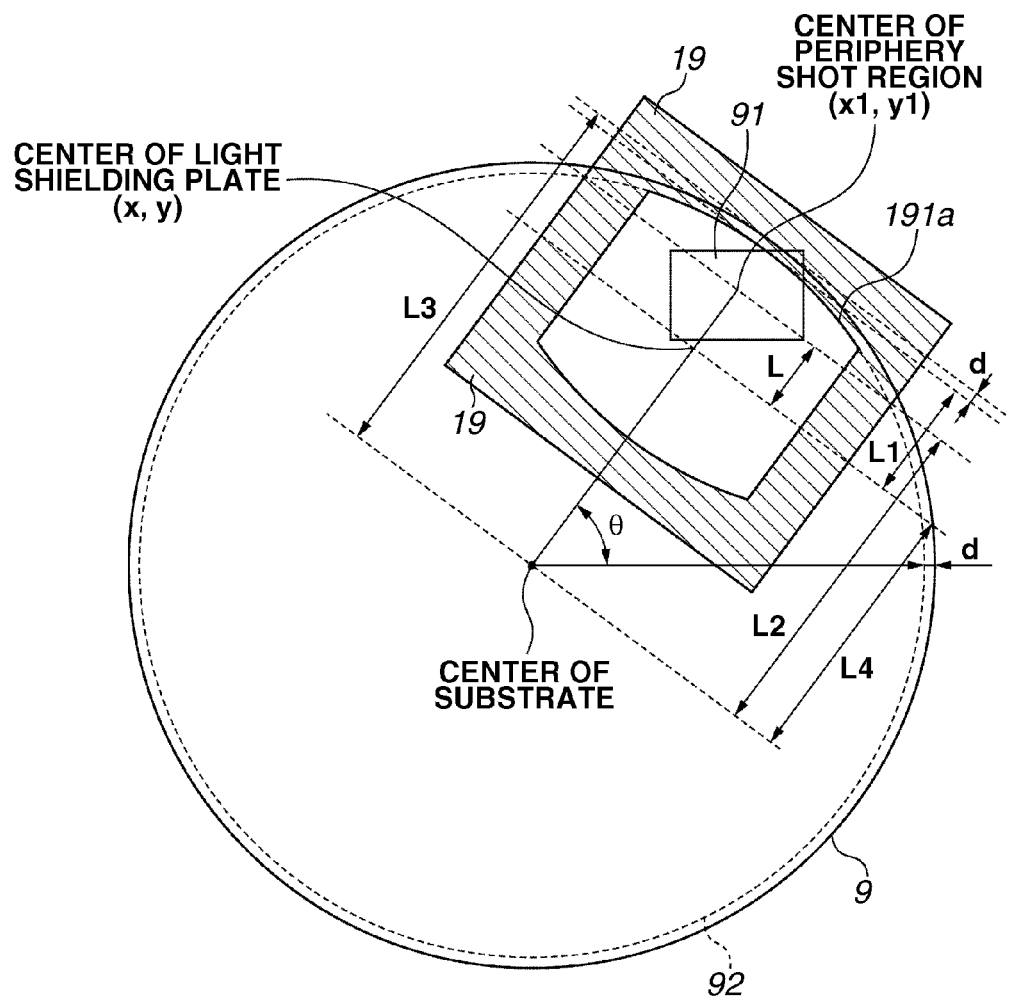
FIG. 5 illustrates positioning of a light shielding plate.

FIG. 5 illustrates positioning of the light shielding plate 19 by the drive unit 22 under the control of the control unit 21. In FIG. 5, the positional relationship between the periphery shot region 91 of the substrate 9 and the light shielding plate 19 is illustrated. As illustrated in FIG. 5, when exposing the periphery shot region 91, the light shielding plate 19 is positioned at a position that shields the exposure light incident on the peripheral region 92 that is near the periphery (outer edge) on the inner side from the periphery (outer edge) of the substrate 9 by the amount "d".

More specifically, the light shielding plate 19 is positioned so that the light shielding plate 19 is rotatably driven by just the amount θ around the optical axis of the illumination optical system 1, and so that the center (x, y) of the light shielding plate 19 is positioned at a position shifted (linearly driven) in the center direction of the substrate 9 from the center (x1, y1) of the periphery shot region 91 by just the amount L. Here, the "center of the periphery shot region 91" is the center of the shot region in a state in which a part of the periphery shot region 91 is not shielded by the arc in the same manner as the center portion.

Basically, the optical axis of the optical system configured from the illumination optical system 1 and the projection optical system 5 is arranged so as to, during exposure of the periphery shot region 91, pass through the center of this periphery shot region 91 and the center of the pattern portion of the reticle.

Further, L is the linear driving amount of the light shielding plate 19, and is represented by the following Equation 1 using the values illustrated in FIG. 5.

$$L = \sqrt{(x1-x)^2 + (y1-y)^2}$$
$$= L2 - L4$$
$$= L2 - \{L3 - (L1+d)\}$$

d: Width of the peripheral region 92.
θ: Amount of rotational driving (i.e., angle formed between the straight line connecting the center of the substrate 9 and the center of the periphery shot region 91 with the horizontal line of the substrate 9).
L: Amount of linear driving of the light shielding plate 19.
L1: Distance from the center of the light shielding plate 19 to the arc edge portion 191a of the light shielding plate 19.
L2: Distance from the center of the substrate 9 to the center of the periphery shot region 91.
L3: Distance from the center of the substrate 9 to the periphery of the substrate 9 (i.e., radius of the substrate 9).
L4: Distance from the center of the substrate 9 to the center of the light shielding plate 19.

Figure 6:
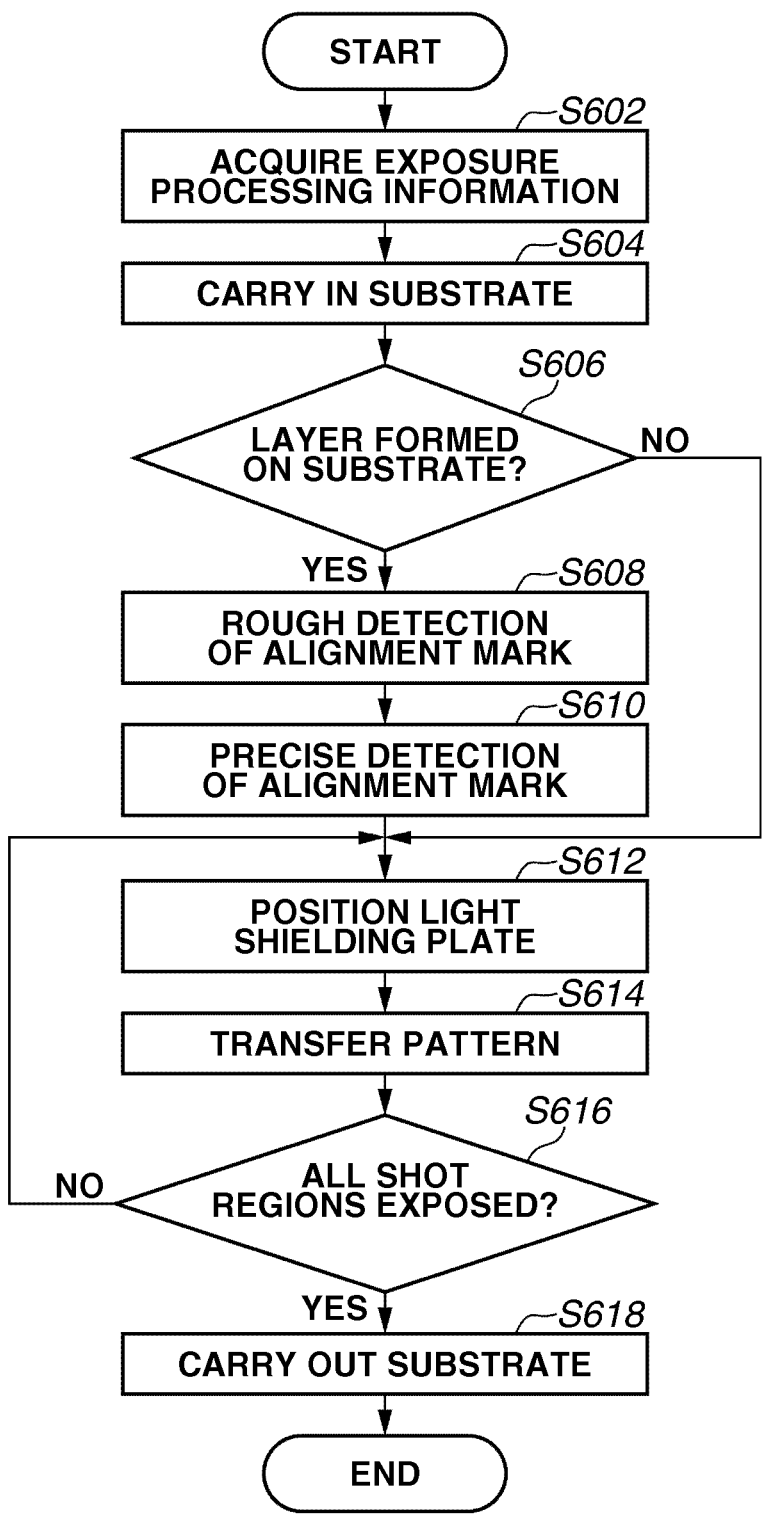
FIG. 6 is a flowchart illustrating exposure processing performed by an exposure apparatus.

The exposure processing performed by the exposure apparatus 100 will now be described with reference to FIG. 6. This exposure processing is performed by the control unit 21 controlling each of the units in the exposure apparatus 100 in an integrated manner. Here, exposure processing performed on one substrate 9 will be described as an example.

In operation S602, exposure processing information relating to the exposure processing of the substrate 9 (i.e., information required when exposing the substrate 9) is acquired. In addition to the exposure parameters, the exposure processing information includes information required for the positioning (control) of the light shielding plate 19.

The exposure processing information includes, for example, information indicating whether a layer (underlayer) is formed on the substrate 9 to be exposed (i.e., whether the exposure processing is a first sequence or a second sequence), and layout information indicating the array of the plurality of shot regions on the substrate 9.

Further, the exposure processing information may also include a substrate arrangement offset indicating the amount of displacement between the center of the substrate 9 and the center of the substrate stage 6 that occurs when arranging the substrate 9 on the substrate stage 6, and light shielding plate control mode information indicating the control mode of the light shielding plate 19 when exposing the periphery shot region 91.

In operation S604, the substrate 9 to be exposed is carried in to the exposure apparatus 100 by a substrate conveyance robot, and this substrate 9 is arranged on the substrate stage 6. During this process, based on the substrate arrangement offset included in the exposure processing information, the substrate 9 is held on the substrate stage 6 so that the center of the substrate 9 and the center of the substrate stage 6 match.

In operation S606, based on the sequence information included in the exposure processing condition acquired in operation S602, it is determined whether a layer is formed on the substrate 9 to be exposed. If it is determined that a layer is formed on the substrate 9 (YES in operation S606), the processing proceeds to operation S608. If it is determined that a layer is not formed on the substrate 9 (NO in operation S606), the processing proceeds to operation S612.

In operation S608, the alignment mark on the layer formed on the substrate 9 is detected (roughly detected) by the alignment detection unit 4 (i.e., pre-alignment is performed). In operation S610, based on the detection result obtained in operation S608, the alignment mark on the layer formed on the substrate 9 is precisely detected (precise detected) by the alignment detection unit 4.

As described below, based on the detection results in operations S608 and S610, the amount of displacement between the center position (substrate center position) of the substrate 9 corresponding to the center position of the substrate stage 6 and the center position (layer center position) of the array of the plurality of shot regions in the layer formed on the substrate 9 may be determined.

In operation S612, the light shielding plate 19 is driven and positioned by the drive unit 22. Specifically, if a layer is not formed on the substrate 9 to be exposed, as described referring to FIG. 5, the light shielding plate 19 is positioned based on the layout information included in the exposure processing condition acquired in operation S602.

Further, if a layer is formed on the substrate 9 to be exposed, the light shielding plate 19 is positioned based on the layout information included in the exposure processing condition acquired in operation S602, and the amount of displacement between the substrate center position and the layer center position determined from the detection results in operations S608 and S610.

However, as described above, the light shielding plate 19 is used for shielding the exposure light incident on the peripheral region 92 when exposing the periphery shot region 91 of the substrate 9. Therefore, if the target shot region (shot region on which the pattern is to be transferred) is not the periphery shot region 91, the light shielding plate 19 does not have to be exactly positioned, as long as the light shielding plate 19 is retracted from the optical path in the illumination optical system 1.

If the target shot region is not the periphery shot (also referred to as circumferential shot) region 91, i.e., if a shot in the center portion of the substrate is to be exposed, the light flux that has passed through the aperture portion 192 of the frame body light shielding plate 19 is shielded by the masking blade 17.

The light flux that has passed through the aperture portion formed by the masking blade 17 reaches the substrate 9, and exposes the substrate. The light shielding plate 19 may be positioned so that the light flux is shielded by the masking blade 17, and is projected on the substrate 9 as a rectangular shape. Further, the positioning of the light shielding plate 19 may be performed in parallel with the movement of the substrate stage 6 that is necessary to position the target shot region on the substrate 9 at the exposure position.

In operation S614, the target shot region on the substrate 9 is exposed to transfer the pattern of the reticle 2 onto this target shot region. In operation S616, it is determined whether all of the shot regions on the substrate 9 held on the substrate stage 6 have been exposed (i.e., whether the pattern has been transferred onto all shot regions).

If it is determined that not all of the shot regions on the substrate 9 have been exposed (NO in operation S616), the processing proceeds to operation S612, and the next shot region is processed as the target shot region. If it is determined that all of the shot regions on the substrate 9 have been exposed (YES in operation S616), the processing proceeds to operation S618. In operation S618, the substrate 9 on which all shot regions have been exposed is collected by the substrate conveyance robot, and the substrate is carried out from the exposure apparatus 100.

Figure 7:
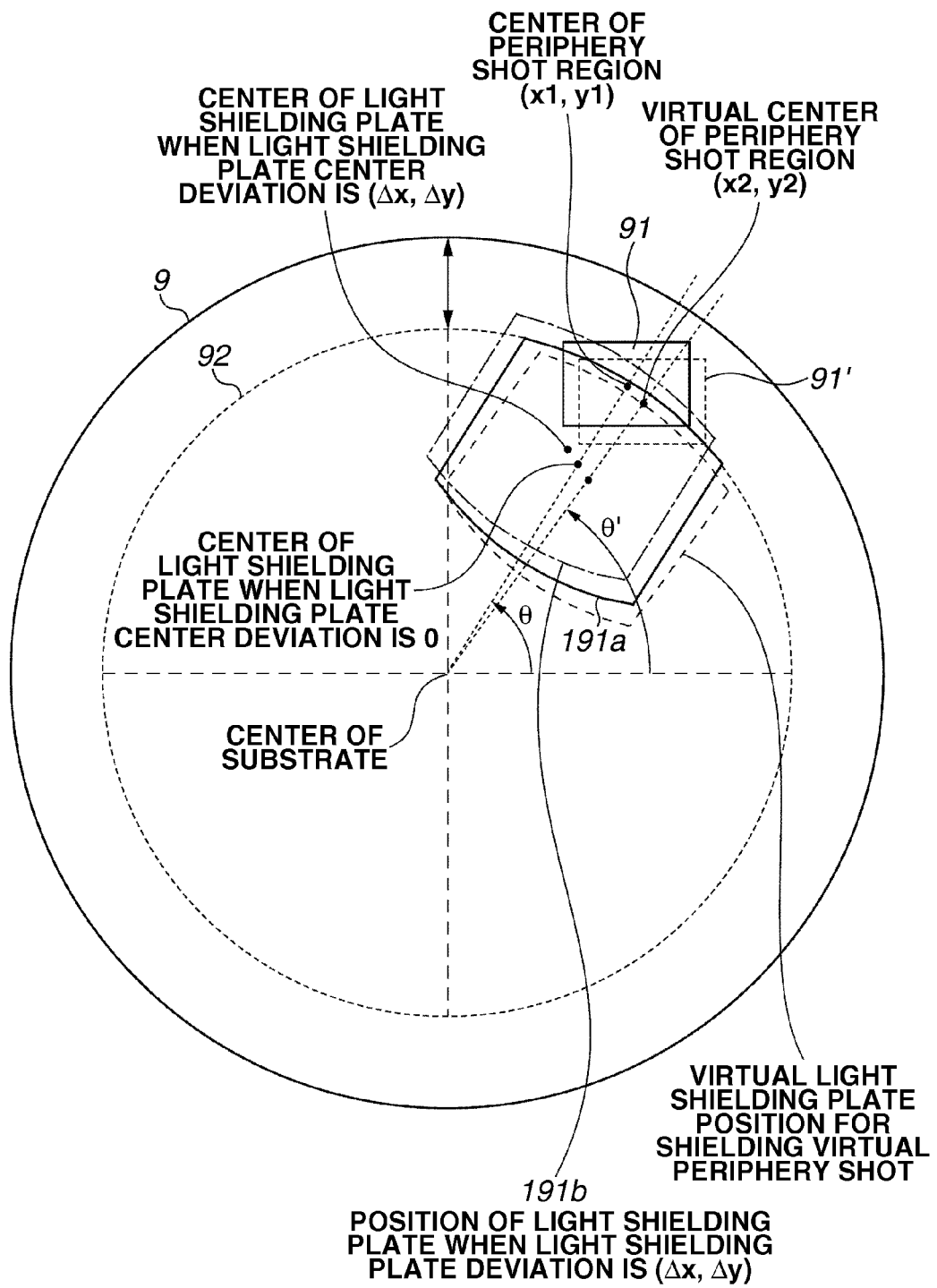
FIG. 7 illustrates positioning of a light shielding plate when the position of an axis of rotation of a rotational drive unit in a light shielding plate and the position of a reference axis are misaligned.

FIG. 7 illustrates a case in which, in a system that does not have the AR3 drive mechanism illustrated in FIG. 4, the position of the axis of rotation, which is the center of rotation of the light shielding plate on a plane (the substrate 9 face or a face parallel thereto) is misaligned from the position of the optical axis by ($\Delta x, \Delta y$). FIG. 7 illustrates the positioning of the light shielding plate 19 by the drive unit 22 under the control of the control unit 21.

The optical axis is an axis (reference axis) that serves as a reference when the image of the pattern on the reticle 2 is projected onto the substrate 9 by the optical system. In this case, the optical axis may be considered as the optical axis of the optical system. More strictly, in the exposure apparatus, calibration is carried out using a mark for adjusting the light source or positioning various parts, so that the optical axis may be considered to be the axis that passes through the center of the shot region on the substrate 9 and the center of the pattern region of the reticle 2 projected on that shot region.

If the axis of rotation, which is the center of rotation of the light shielding plate 19, is misaligned from the optical axis by ($\Delta x, \Delta y$), the light shielding plate 19 is to be arranged at the position of 191*a* to shield the periphery shot region 91. However, when the displacement amount of the axis of rotation, which is the center of rotation of the light shielding plate 19, illustrated by the dotted line is ($\Delta x, \Delta y$), due to this displacement amount, the light shielding plate 19 is mispositioned at the position of 191*b* illustrated by the dotted line.

Therefore, to correctly arrange the light shielding plate 19 at the position of 191*a*, in the procedure for calculating θ and L illustrated in FIG. 5, a virtual periphery shot region 91' is calculated.

$$x2 = x1 - \Delta x$$

$$y2 = y1 - \Delta y$$

θ' and L are calculated based on the method illustrated in FIG. 5 with respect to this virtual periphery shot center (x2, y2).

θ': Amount of rotational driving of the light shielding plate 19 (i.e., angle formed between the straight line connecting the center of the substrate 9 and the center of the periphery shot region 91' with the horizontal line of the substrate 9).

L: Amount of linear driving in the virtual periphery shot region 91'.

The virtual light shielding plate position when the light shielding plate 19 is driven by θ' and L is the position indicated by the dotted line. In this case, at the position that is actually shielded, since the amount of displacement of the center of rotation of the light shielding plate is ($\Delta x, \Delta y$), the light shielding plate is arranged at a position of 191*a* that is shifted by ($\Delta x, \Delta y$).

$\Delta x$ and $\Delta y$ may be obtained by inputting values calculated based on either the method described in the second exemplary embodiment or the third exemplary embodiment via the input interface 51. The input interface 51 may be either a user interface provided in the apparatus or an interface that receives information via a network.

The amount of displacement ($\Delta x, \Delta y$) of the center of rotation of the light shielding plate is information indicating the relative positions of the optical axis and the center of rotation of the light shielding plate 19, i.e., displacement direction and displacement amount. This information indicating the relative positions may also be acquired as coordinate information from a predetermined reference as stage coordinate system coordinates or substrate coordinate system coordinates.

This information indicating the relative positions is acquired by an acquisition unit, such as the calculation unit according to the second exemplary embodiment, the calculation unit according to the third exemplary embodiment, or from a (not illustrated) memory (storage unit) in the exposure apparatus 100 input via an input interface.

In a system having the AR3 drive mechanism illustrated in FIG. 4, the $\Delta x, \Delta y$ displacement amount of the center of rotation of the light shielding plate may also be corrected based on the drive amount of AR2 and AR3, without correcting the angle of rotation θ.

Figure 8:
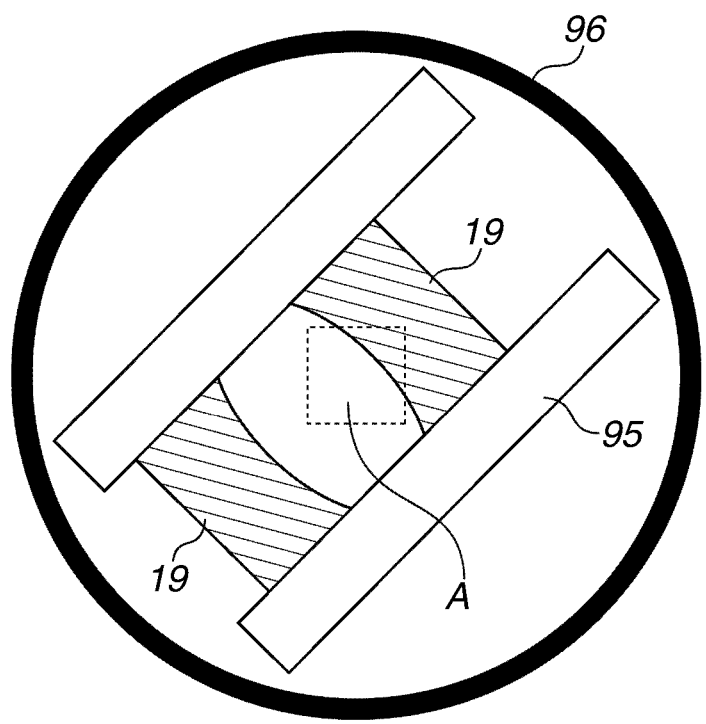
FIG. 8 illustrates a light shielding plate according to a second exemplary embodiment.

As illustrated in FIG. 8, the light shielding plate 19 has an aperture. The aperture includes a first arc and a second arc arranged on positions on opposite sides of the aperture edge. The first and second arcs have a convex shape that protrudes toward the outer side direction from the inner side of the aperture.

In the example illustrated in FIG. 8, as an example of the drive unit 22, a linear drive unit 95 is mounted on a rotational drive unit 96, which enables the light shielding plate 19 to be driven in a radial direction and a rotating direction around the optical axis. Some other configuration may be employed for this, as long as the light shielding plate 19 may be driven in a radial direction and a rotating direction around the optical axis.

In FIG. 8, region A enclosed by the dotted line illustrates the appearance of a shot region on the light shielding plate 19 when it is shielded. The shape that is shielded by the light shielding plate 19 is transferred onto the wafer.

The light shielding plate 19 further includes an aperture member or a light shielding member. The aperture member or light shielding member function as a rotational drive amount identification unit for identifying the rotational drive amount of the rotational drive unit 96. The method for calculating the rotational drive amount using the aperture member or light shielding member will be made clear in the present exemplary embodiment.

Figure 9A:
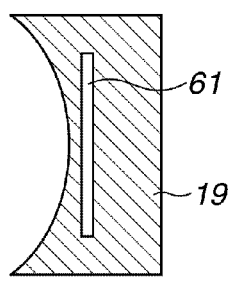
FIGS. 9A to 9F illustrate light shielding plate configurations.
Figure 9B:
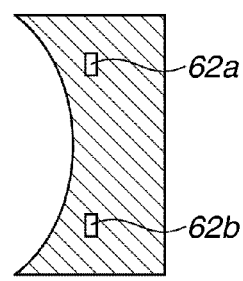

FIGS. 9A to 9F illustrate an example of the aperture member or light shielding member of the light shielding plate 19. In the example illustrated in FIG. 9A, a slit-shaped aperture member 61 that includes a straight portion on an edge is provided in the light shielding plate 19 as an example of an aperture member. As illustrated in FIG. 9B, the aperture member may be configured as slit-shaped aperture members 62a and 62b including a straight portion on an edge may be vertically split.

Figure 9C:
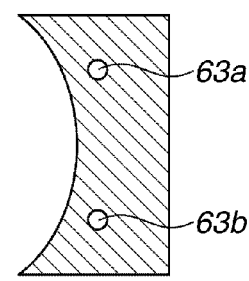
Figure 9D:
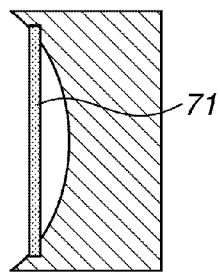

Further, as illustrated in FIG. 9C, the aperture member does not have to be a slit shape including a straight portion. The aperture member may be configured as aperture members 63a and 63b having a round hole shape, for example. Moreover, the aperture member may be some other shape, as long as it is symmetrical about the center of gravity of the shape of the aperture member. In the example illustrated in FIG. 9D, the light shielding plate 19 is provided with a slit-shaped light shielding member 71 that includes a straight portion on an edge as an example of the light shielding member.

Figure 9E:
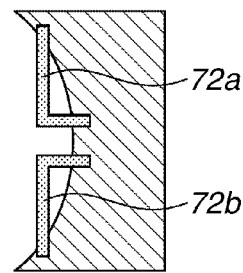
Figure 9F:
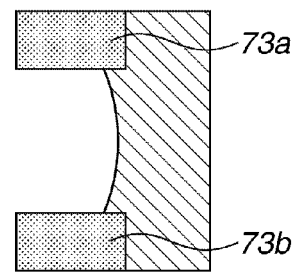

As illustrated in FIG. 9E, slit-shaped light shielding members 72a and 72b including a straight portion on an edge may be vertically split. FIG. 9F illustrates a case in which the longitudinal direction of the light shielding member is different along the edges of the arc. Similarly, light shielding members 73a and 73b may also be vertically split.

Although FIGS. 9A to 9F illustrate shapes for a case in which the light shielding plate 19 is configured with a first arc and a second arc on separate light shielding plates. However, as illustrated in FIG. 4, the first and second arcs may also be configured on an integrated light shielding plate. Further, in the case of an integrated light shielding plate, the aperture member or light shielding member may be arranged at positions similarly corresponding to the arcs.

To form the non-exposed region indicated by width "d" on a circumferential portion of the substrate 9, the following two conditions need to be satisfied.

Condition 1. That the reticle 2 and the light shielding plate 19 have been aligned (their positional relationship has been clarified).

Condition 2. That the reticle 2 and the substrate 9 have been aligned (their positional relationship has been clarified).

An adjustment method for realizing condition 1 when condition 2 is satisfied will now be described in detail. In this example, the reticle 2 reference point has been aligned with respect to the optical axis based on a detection result from the alignment detection unit 4 illustrated in FIG. 1. The series of processes including exposure processing, stage driving, and driving of the light shielding plate performed in the following adjustment flow is executed by the control unit 21.

First, in operation S1001 in the flowchart of FIG. 10, positioning of the reference point of the reticle 2 (hereinafter referred to as "center 2c of the reticle 2") and the center of rotation 96c of the rotational drive unit 96 is performed. FIG. 11 illustrates the reticle 2 used for this positioning as viewed from above a sheet of paper, which defines the X axis and the Y axis as illustrated in FIG. 11.

The reticle 2 includes at least two scales 40a and 40b as a pattern that may be transferred onto the substrate. The Y coordinate from the center of the reticle 2 in the scale 40 is known. The value of the scale 40 represents the X coordinate on the reticle 2. The light shielding plate 19 has the shape illustrated in FIG. 9A.

The positioning of the center 2c of the reticle 2 and the center of rotation 96c of the rotational drive unit 96 will be described in detail based on the flowchart illustrated in FIG. 12. In the description of this example, the first arc of the light shielding plate 19 will be used.

In operation S2001, the reticle and the wafer are carried in, and exposure conditions such as the exposure amount, layout on the wafer, and drive unit drive conditions are set. In operation S2002, the light shielding plate 19 is rotatably driven by the rotational drive unit 96 and linearly driven by the linear drive unit 95 based on the drive conditions, so that the light shielding plate 19 moves to the first position illustrated as an example in FIG. 13A.

Figure 13A:
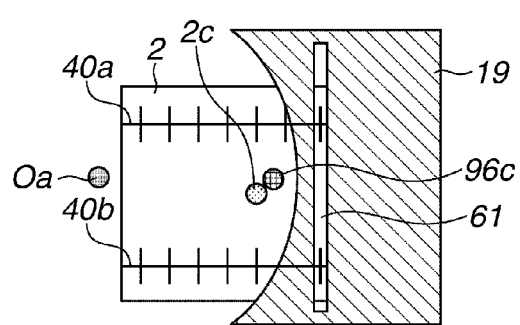
FIGS. 13A to 13D illustrate a method for calculating a center of rotation of a drive unit.

As is clear from FIG. 13A, at the first position, the reticle 2 is shielded by the light shielding plate 19, and the first arc of the shielding plate 19 and an aperture member 23 are positioned on the reticle 2. Although the rotational drive unit 96 and the linear drive unit 95 are not illustrated in FIG. 13, the relationship among the light shielding plate 19, the rotational drive unit 96, and the linear drive unit 95 is as illustrated in FIG. 8. At the same time, the substrate stage 6 holding the substrate 9 is driven to a shot position. In operation S2003, a predetermined exposure amount is irradiated on the substrate 9 from the irradiation system.

Figure 13B:
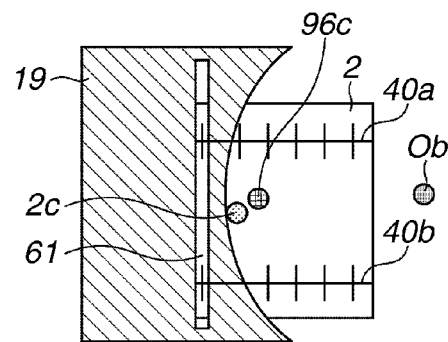

A shot S1 is transferred onto the substrate 9 as the shape defined by the pattern of the reticle 2 by the light shielding plate 19. In operation S2004, with the linear drive shaft direction fixed based on the drive unit drive conditions, the light shielding plate 19 rotatably driven 180° around the center of rotation 96c of the rotational drive unit 96 to move to a second position (FIG. 13B). At the same time, the substrate stage 6 holding the substrate 9 is driven to the next shot position.

In operation S2005, the shot S2 is similarly transferred by irradiating a predetermined exposure amount on the substrate 9 from the irradiation system. In operation S2006, the substrate 9 is carried out, and development is performed. With this development, a resist image of the shots S1 and S2 is formed on the substrate 9.

In operation S2007, based on the shot S1 of the first position and the shot S2 of the second position of the light shielding plate 19, the center of rotation 96c of the rotational drive unit 96 with respect to the center 2c of the reticle 2 is determined.

Figure 14A:
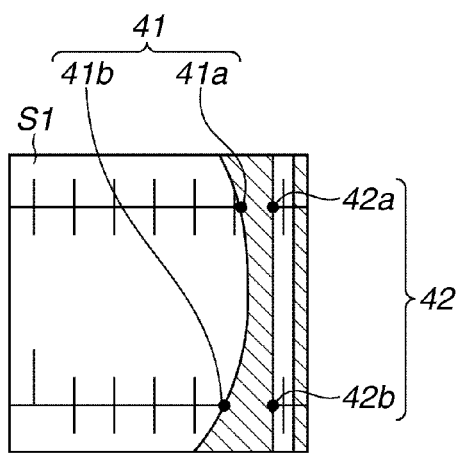
FIGS. 14A and 14B illustrate a shot shape transferred on a wafer as an exposure result obtained when calculating the position of an axis of rotation of a rotational drive unit.

The values 41a and 41b of the intersection of the scales 40a and 40b with the edge of the first arc of the light shielding plate 19 for the shot S1 illustrated in FIG. 14A are read and recorded. At the same time, the values 42a and 42b of the intersection of the scales 40a and 40b with the straight edge of the straight slit-shaped aperture member 61 for the shot S1 are read and recorded.

Figure 14B:
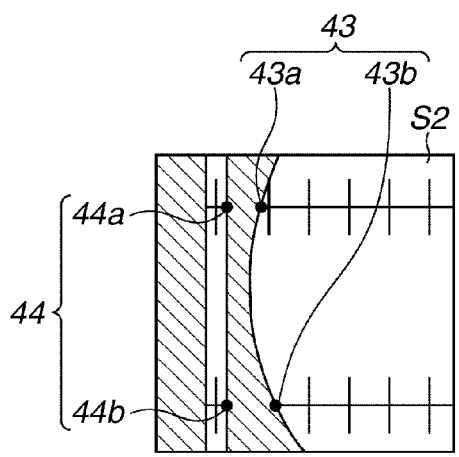

The values (43a, 43b, 44a, and 44b) for the shot S2 illustrated in FIG. 14B are similarly read and recorded. The reading of the scales may be performed using a multi-purpose light microscope, for example. Although FIGS. 14A and 14B illustrate a case in which the resist at the exposed portion has peeled away due to development, i.e., a case in which a positive resist is used, a negative resist may also be used. In this example, a case in which a positive resist is used will be described as such a case is easier to illustrate.

Thus, the scale 40 indicates the coordinate value of a center reference of the reticle 2. First, the center coordinate Oa of a first circle formed by the first arc is calculated based on the scale values 41a and 41b for the first position shot S1 and the radius of the first arc. Similarly, the center coordinate Ob of a second circle formed by the first arc is calculated based on the scale values 43a and 43b for the second position shot S2 and the radius of the first arc.

The center point O of the center coordinates Oa and Ob of the first and second circles is the center of rotation of the rotational drive unit 96. Based on this, position adjustment is performed so as to match the center of the reticle 2 with the center of rotation of the rotational drive unit 96.

However, there will always be error in the angle of rotation when rotatably driving from the first position to the second position with the rotational drive unit 96. Although there are various causes for this error in the angle of rotation of the rotational drive unit 96, examples include error in the rotary encoder used to detect the motor angle, and gear backlash. Thus, in practice, it is impossible to eliminate error.

Figure 13C:
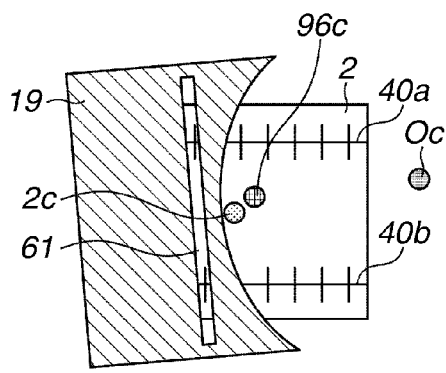

FIG. 13C illustrates a case in which the light shielding plate 19 has been rotated 180+α° (wherein α is rotation error) from a first position to a second position. The center coordinate Oc of a second circle formed by the first arc is obtained from a shot exposed in the state illustrated in FIG. 13C. The center point Oe of the center coordinates Oa and Oc of the first and second circles is determined as the center of rotation 96c of the rotational drive unit 96. That is, a point different from the true center of rotation 96c is calculated.

Figure 13D:
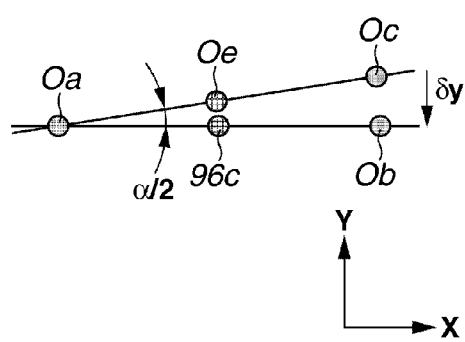

As illustrated in FIG. 13D, this has a substantial effect especially on the calculation accuracy of the Y coordinate of a center rotation coordinate. Therefore, correction is performed using the value of the intersection of the scale 40 with the straight edge of the simultaneously-recorded slit-shaped aperture member 61.

The slope T1 of the straight line that passes through the two points of coordinates 42a and 42b of the intersection of the scale 40 with the straight edge of the slit-shaped aperture member 61 at the first position is obtained. Similarly, the slope T2 of the straight line that passes through the two points of coordinates 44a and 44b of the intersection of the scale 40 with the straight edge of the slit-shaped aperture member 61 at the second position is obtained.

If the light shielding plate 19 is correctly rotated by 180° from the first position to the second position, these two slopes are identical, i.e., T1=T2. By calculating the difference T1−T2=α of these two slopes, it may be seen that the actual angle of rotation when rotated from the first position to the second position is 180+α°.

Next, a correction method using the actual angle of rotation will be described. If the distance in the X direction between the center coordinate Oa of the first circle at the first position and the center coordinate Oc of the second circle at the second position is P, then it may be seen that since the error in the angle of rotation for a rotation angle of 180° is α°, the Y coordinate Ocy of the center coordinate Oc of the second circle at the second position is corrected based on that.

A correction amount δy may be defined by P sin(α/2). The calculation accuracy for determining the center of rotation 96c of the rotational drive unit 96 may be improved based on the corrected center coordinate Od of the second circle at the second position and the center coordinate Oa of the first circle at the first position even if there is error in the angle of rotation for the rotational drive unit 96.

Based on the above result, the center of rotation 96c of the rotational drive unit 96 may be adjusted so that it matches the center 2c of the reticle 2. Further, although it is desirable for the first arc, the aperture member and the light shielding member of the light shielding plate 19 to be simultaneously projected onto the wafer, the disclosure is not limited to this. By restricting the illumination region with the masking blade 17, the positioning adjustment of the center of rotation of the rotational drive unit 96 and the reticle 2 may be performed by individually projecting onto the substrate.

Further, although the scale 40 on the reticle 2 is arranged along the X axis, this scale 40 may also be arranged along the Y axis. In this case, the positioning adjustment may be performed by rotating the first and second positions of the light shielding plate 19 by further 90° from the case described in this exemplary embodiment. In addition, the positioning adjustment may also be performed by rotating the first and second positions to an appropriate position based on the scale on the reticle 2.

Figure 10:
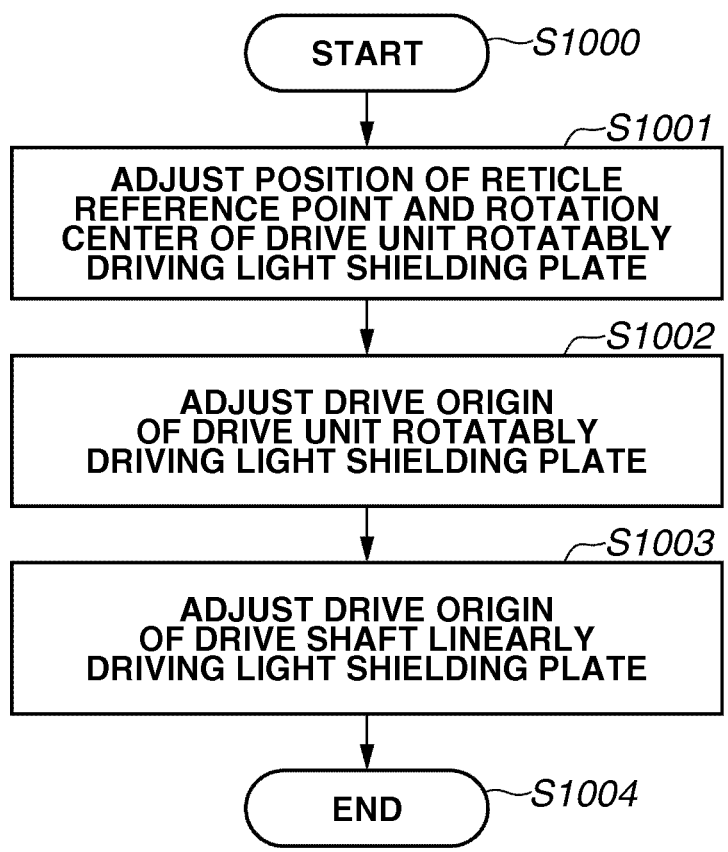
FIG. 10 is a flowchart illustrating a method for adjusting the position of a light shielding plate with respect to a reticle.
Figure 11:
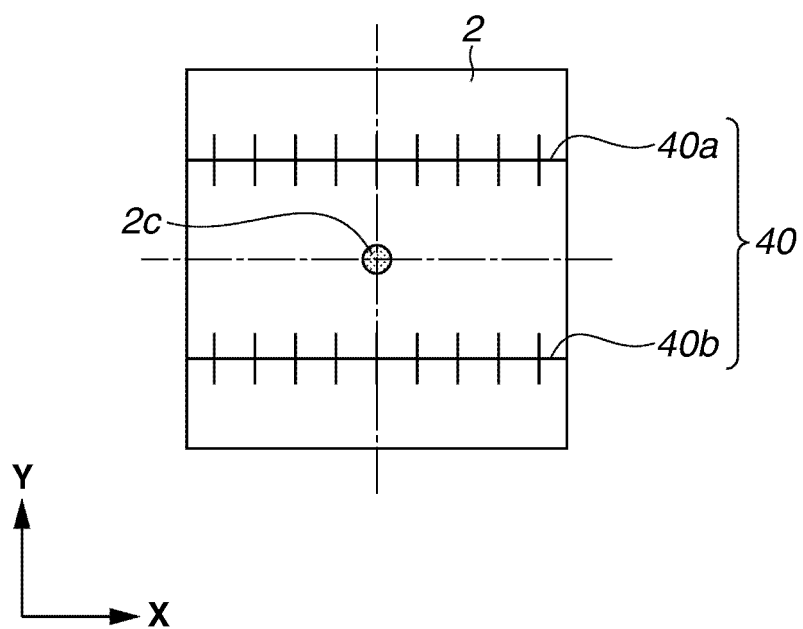
FIG. 11 illustrates a reticle used for adjusting the position of a light shielding plate.

Next, in operation S1002 of the flowchart illustrated in FIG. 10, the drive origin of the linear drive unit 95 that rotatably drives the light shielding plate 19 is adjusted. Based on this adjustment, the X axis of the reticle 2 and the drive shaft of the linear drive unit 95 that linearly drives the light shielding plate 19 may be made parallel. In FIG. 13, although an already parallel state is illustrated for simplification, in actual practice there is error in the shape of the parts and in how the parts are installed, so that the X axis and the drive shaft are not parallel.

The drive origin of the rotational drive unit 96 may be set so as to have an offset so that the slope of the straight line passing through the center coordinate Oa of the first circle and the center coordinate Od of the second circle as determined above is zero. Further, the same adjustment may be performed for the second arc of the light shielding plate 19.

Next, in operation S1003 of the flowchart illustrated in FIG. 10, the drive origin of the linear drive unit 95 that linearly drives the light shielding plate 19 is adjusted. Based on this adjustment, the positions in the drive shaft direction of the linear drive unit 95 and the X axis direction of the reticle 2 are matched. The linear drive unit 95 is then fixed, and the light shielding plate 19 is driven by the linear drive unit 95 to the position where the scale 40 on the reticle 2 intersects the first arc of the light shielding plate 19.

The substrate 9 is exposed in this state. After carrying out the wafer and developing, the drive origin of the linear drive unit 95 may be set so as to have an offset by reading the value of the intersection of the scale 40 with the first arc and setting so that this value is a designated value. Based on this adjustment, the positioning of the first arc of the light shielding plate 19 with the reticle 2 is completed. Further, the same adjustment may be performed for the second arc of the light shielding plate 19.

In the second exemplary embodiment, the light shielding plate 19 is described based on FIG. 9A. However, it is obvious that adjustment may be performed in the same manner even for the shapes illustrated in FIGS. 9B, 9C, 9D, 9E, and 9F.

For the light shielding plate 19 illustrated in FIG. 9F, the actual angle of rotation may be calculated using the straight edge of a light shielding member 73a or 73b. In this case, it is necessary to further provide a scale that intersects with the straight edge of the light shielding member 73a or 73b in addition to the scale 40 on the reticle 2.

Further, if a straight edge portion 191b of the light shielding plate 19 illustrated in FIG. 4 may be projected along with the circle edge on the wafer, such a configuration may be similarly used for the calculation of the actual angle of rotation. Moreover, although the second exemplary embodiment is described based on the minimum number of shots required for adjustment, in actual practice an average of a plurality of shots may be used to reduce the effect of scale reading error on calculation accuracy. According to one embodiment, the number of shots is not limited.

In addition, in the second exemplary embodiment, although the center coordinate of a circle is calculated based on the coordinates of two scales on the reticle 2 and the radius of an arc, the center of a circle may be calculated based on the coordinates of three scales by providing at least one more scale on the reticle. Similarly, to reduce the effect of scale reading error on calculation accuracy, an average of the center coordinates of a circle determined from the respective combinations of three scales from among a plurality of scales may also be used.

It may be understood that, in the second exemplary embodiment, the purpose of an aperture member or a light shielding member is to be used for positional adjustment. When forming a light shielding region defined by a light shielding width d from a periphery of the substrate 9, pattern transfer onto the wafer by the aperture member or the light shielding member is not unnecessary. It may even be a problem. Specifically, pattern transfer of the aperture member or the light shielding member is only performed when adjusting the position of the light shielding plate 19. Consequently, the aperture member or the light shielding member needs to be selected based on whether pattern transfer onto the wafer is to be performed.

More specifically, this member may be selected based on whether an aperture member is to be blocked, or whether a light shielding member is to be removed or moved to a position where pattern transfer onto the wafer does not occur. Further, the unit for selecting whether a pattern is to be transferred onto the wafer by an aperture member or a light shielding member may be automatic or manual, and the method for performing this selection is not limited.

Figure 12:
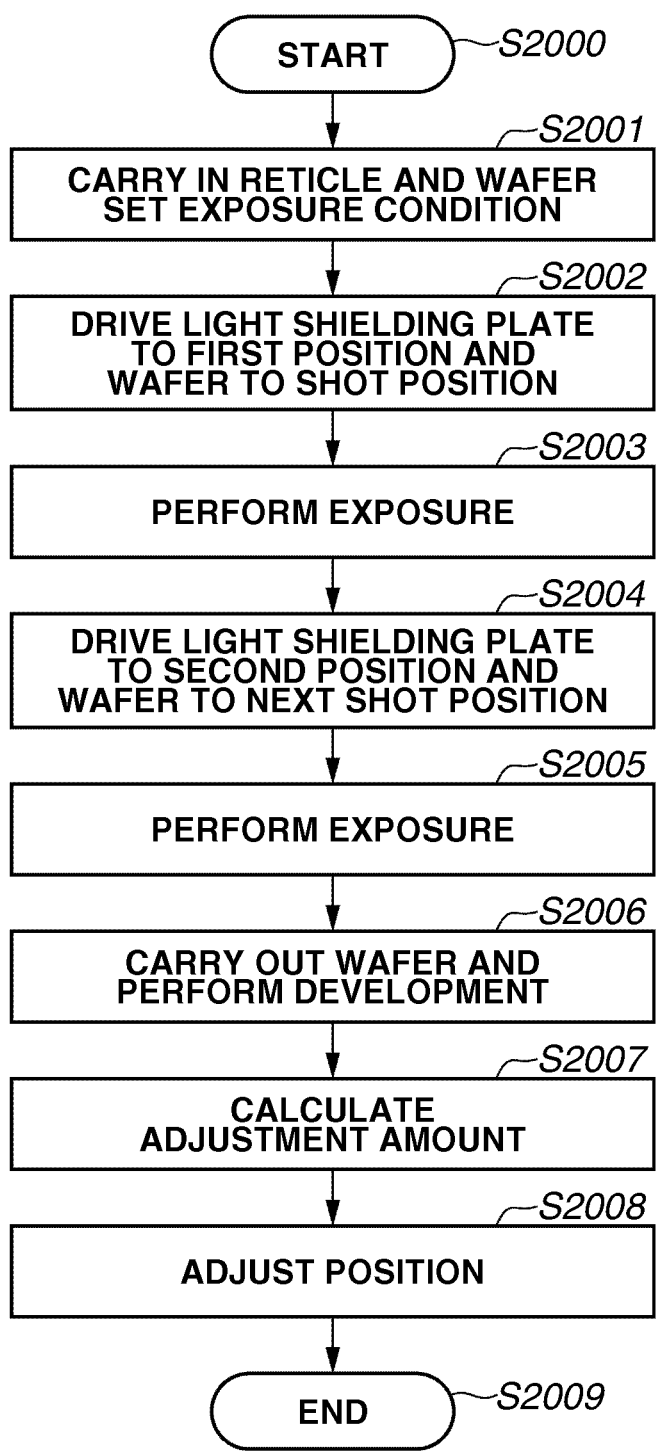
FIG. 12 is a flowchart illustrating a method for calculating a center of rotation of a drive unit.

In the second exemplary embodiment, the adjustment performed in operation S1001 of the flowchart illustrated in FIG. 12 is performed based on information obtained from a shot exposed on the substrate 9. However, the adjustment may also be performed using a light detection sensor 50 on the substrate stage 6. The light detection sensor 50, which is a light detection unit, is a sensor that receives light irradiated from an illumination system and detects an exposure light quantity on the wafer face.

An edge of the light shielding plate 19 may be detected by the light detection sensor 50 based on a stage coordinate reference. More specifically, the coordinates at which illuminance is zero may be detected while driving the stage. Based on the two coordinates at which illuminance is zero and the radius of the arc, the center coordinate of that circle may be determined.

Similarly, using FIG. 9A as an example, the slope of the slit straight portion of the aperture member may also be determined. If the light shielding plate 19 has the shape illustrated in FIG. 9C, the position of the center of gravity for each of aperture members 63a and 63b may be detected using an illuminance detection sensor. It may be easily understood that even if the aperture member has no straight portions, the above-described angle correction may be performed by using the slope of the straight line connecting the two centers of gravity.

The series of processes including projection processing on the light detection sensor 50, stage driving, and driving of the light shielding plate is executed by the control unit 21. The light detection sensor 50 detection result is processed by a detection calculation unit, and the obtained displacement amount of the center of rotation is registered in a database.

Then, the drive unit for driving the light shielding plate is corrected by the control unit 21 based on the displacement amount of the center of rotation registered in the database. When an illuminance detection sensor is used, note that the relationship between the reticle and the center of rotation of the drive unit is not directly applied.

In this case, it is necessary to know in advance the positional relationship between the wafer on the substrate stage 6 and the illuminance detection sensor, and indirectly align the reticle center with the center of rotation of the drive unit. Further, it may easily be understood that the adjustment performed in operations S1002 and S1003 of the flowchart illustrated in FIG. 10 also may be similarly performed using the light detection sensor 50.

Next, the method for manufacturing a device (a semiconductor device, a liquid crystal display device etc.) according to an exemplary embodiment will be described. A semiconductor device is manufactured by performing a pre-process of producing an integrated circuit on a wafer, and a post-process of completing the integrated circuit chip on the wafer produced in the pre-process as a finished product.

The pre-process includes an operation of exposing a wafer coated with a photosensitizing agent using the above-described exposure apparatus, and an operation of developing the wafer. The post-process includes an assembly operation (dicing and bonding), and a packaging operation (encapsulating). A liquid crystal display device is manufactured by performing a process for forming a transparent electrode.

The process for forming the transparent electrode includes an operation of coating a photosensitizing agent on a glass substrate on which a transparent electrode film has been vapor deposited, an operation of exposing the glass substrate coated with the photosensitizing agent using the above-described exposure apparatus, and an operation of developing the glass substrate. Based on the device manufacturing method according to the present exemplary embodiment, a device having a higher quality than conventional devices may be manufactured.

While the disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-209100 filed Sep. 26, 2011, which is hereby incorporated by reference herein in its entirety.

What is claimed is:

1. An exposure apparatus including an optical system having an illumination optical system configured to illuminate an original and a projection optical system configured to project an image of a pattern formed at the original on a substrate that includes an arc-shaped portion on an outer edge, the exposure apparatus comprising:

a light shielding plate arranged on or near to a conjugate plane with a object plane of the projection optical system in the optical system, and including an arc-shaped portion for defining at least a part of an outer edge of a region on which the image of the pattern is projected on the substrate in an arc shape;

a rotational drive unit configured to rotatably drive the light shielding plate around an axis of rotation along an optical path in the optical system;

a shift drive unit configured to shift-drive the light shielding plate in a direction intersecting the axis of rotation;

an acquisition unit configured to acquire information relating to a relative position between a reference axis serving as a reference when the image of the pattern is projected on the substrate by the optical system and the axis of rotation; and a control unit configured to control the rotational drive unit and the shift-drive unit so that the light shielding plate is positioned at a predetermined position based on the information relating to the relative position.

2. The exposure apparatus according to claim 1, wherein a radius of curvature of the arc-shaped portion of the light shielding plate is smaller than the radius of curvature of the arc-shaped portion of an outer edge of the substrate.

3. The exposure apparatus according to claim 1, wherein the information relating to the relative position is information indicating an amount of displacement in a displacement direction of the axis of rotation with respect to the reference axis.

4. The exposure apparatus according to claim 1, wherein the information relating to the relative position between the reference axis and the axis of rotation is acquired using light from a light source in a state in which the light shielding plate has been arranged at two rotatably driven positions that are different to each other by controlling the rotational drive unit with the control unit to rotatably drive the light shielding plate.

5. The exposure apparatus according to claim 1, further comprising a substrate stage configured to hold and move the substrate including a light detection unit thereon,
  wherein the acquisition unit is configured to acquire the information relating to the relative position based on information obtained by receiving with the light detection unit light from a light source in a state in which the light shielding plate has been rotatably driven and arranged at two different positions.

6. The exposure apparatus according to claim 1, further comprising a light shielding member different from the light shielding plate for defining the region,
  wherein the light shielding plate is a frame that has an aperture portion in a center position thereof, and in which the arc-shaped portion is formed at a position facing the aperture portion, and
  wherein when the image of the pattern is projected near a center of the substrate, the light from a light source that reaches a region where the image of the pattern is projected on the substrate passes through the aperture portion of the frame, and defines the region with the light shielding member.

7. A method for manufacturing a device comprising:
exposing a substrate using the exposure apparatus according to claim 1; and
developing the exposed substrate.

* * * * *